(12) United States Patent
Cok

(10) Patent No.: US 7,969,085 B2
(45) Date of Patent: Jun. 28, 2011

(54) COLOR-CHANGE MATERIAL LAYER

(75) Inventor: Ronald S. Cok, Rochester, NY (US)

(73) Assignee: Global OLED Technology LLC, Wilmington, DE (US)

( * ) Notice: Subject to any disclaimer, the term of this patent is extended or adjusted under 35 U.S.C. 154(b) by 437 days.

(21) Appl. No.: 11/465,723

(22) Filed: Aug. 18, 2006

(65) Prior Publication Data
US 2008/0042552 A1 Feb. 21, 2008

(51) Int. Cl.
*H01J 1/62* (2006.01)
*H01J 63/04* (2006.01)
(52) U.S. Cl. ......... 313/504; 313/501; 313/503; 313/506
(58) Field of Classification Search .......... 313/501, 313/503, 504, 506; 427/66
See application file for complete search history.

(56) References Cited

U.S. PATENT DOCUMENTS

| | | | |
|---|---|---|---|
| 4,476,292 A | 10/1984 | Ham et al. | |
| 4,769,292 A | 9/1988 | Tang et al. | |
| 5,061,569 A | 10/1991 | Vanslyke et al. | |
| 5,126,214 A | 6/1992 | Tokailin et al. | |
| 5,247,190 A | 9/1993 | Friend et al. | |
| 5,294,870 A | 3/1994 | Tang et al. | |
| 6,137,459 A | 10/2000 | Eida et al. | |
| 6,226,890 B1 | 5/2001 | Boroson et al. | |
| 6,392,340 B2 | 5/2002 | Yoneda et al. | |
| 6,661,029 B1 * | 12/2003 | Duggal | 257/89 |
| 6,747,405 B2 * | 6/2004 | Hosokawa | 313/504 |
| 6,771,028 B1 * | 8/2004 | Winters | 315/169.1 |
| 7,812,359 B2 * | 10/2010 | Lee | 257/98 |
| 2003/0071567 A1 * | 4/2003 | Eida et al. | 313/504 |
| 2003/0073042 A1 * | 4/2003 | Cernigliaro et al. | 430/321 |
| 2004/0145895 A1 * | 7/2004 | Ouderkirk et al. | 362/260 |
| 2004/0212296 A1 | 10/2004 | Nakamura et al. | |
| 2004/0217702 A1 * | 11/2004 | Garner et al. | 313/512 |
| 2004/0233139 A1 | 11/2004 | Asano et al. | |
| 2004/0245921 A1 * | 12/2004 | Lu et al. | 313/504 |
| 2004/0252933 A1 | 12/2004 | Slyvester et al. | |
| 2005/0012076 A1 | 1/2005 | Morioka | |
| 2005/0057176 A1 | 3/2005 | Lu et al. | |
| 2005/0057177 A1 | 3/2005 | Lu et al. | |
| 2005/0116621 A1 | 6/2005 | Bellmann et al. | |
| 2005/0140275 A1 | 6/2005 | Park | |
| 2005/0275615 A1 | 12/2005 | Kahen et al. | |
| 2006/0158103 A1 * | 7/2006 | Katano et al. | 313/504 |

OTHER PUBLICATIONS

C.W. Tang, S.A. VanSlyke, and C.H. Chen; "Electroluminescence Of Doped Organic Thin Films"; Journal of Applied Physics; vol. 65; No. 9; May 1, 1989; pp. 3610-3616.
C.W. Tang and S.A. VanSlyke; "Organic Electroluminescent Diodes"; Applied Physics Letters; vol. 51; No. 12; Sep. 21, 1987; pp. 913-915.
U.S. Appl. No. 11/065,082, filed Feb. 24, 2006; titled "OLED Device Having Improved Light Output"; of Ronald S. Cok, Donald R. Preuss, Yuan-Sheng Tyan.

(Continued)

*Primary Examiner* — Peter J Macchiarolo
*Assistant Examiner* — Thomas A Hollweg
(74) *Attorney, Agent, or Firm* — McKenna Long & Aldridge LLP

(57) ABSTRACT

A color-change material layer comprising: a color-change material that converts light of a second frequency range higher than a first frequency range to light of the first frequency range; and a transparent material having a refractive index of at least 1.6 intermixed with the color-change material, wherein the layer is substantially non-scattering to light of the first frequency range.

13 Claims, 5 Drawing Sheets

OTHER PUBLICATIONS

U.S. Appl. No. 11/361,094, filed Feb. 24, 2006; titled "Light-Scattering Color-Conversion Material Layer"; of Ronald S. Cok, Mitchell S. Burberry.

U.S. Appl. No. 11/387,492, filed Mar. 23, 2006; titled "OLED Device Having Improved Light Output"; of Ronald S. Cok, Michael L. Boroson.

* cited by examiner

COLOR-CHANGE MATERIAL LAYER

FIELD OF THE INVENTION

The present invention relates color change material layers, and more particularly to use of such layers in an organic or inorganic LED display device, and further to device structures for improving the efficiency of such display devices employing broadband emitters and color filters.

BACKGROUND OF THE INVENTION

Flat-panel organic LED display devices employ a variety of technologies for emitting patterned, colored light to form full-color pixels. In one approach, different materials emitting light of different colors in response to a current are patterned over a surface. However, such patterning is difficult and expensive and current technologies, such as the use of shadow-masks, are limited in resolution and size. In an alternative approach, a common light-emitter is employed for all of the pixels. One such design relies upon a white-light emitting common organic layer in combination with color filters, for example red, green, and blue, to create a full-color display. The color filters may be located on the substrate, for a bottom-emitter, or on the cover, for a top-emitter. For example, U.S. Pat. No. 6,392,340 entitled "Color Display Apparatus having Electroluminescence Elements" issued May 21, 2002 illustrates such a device. However, such designs are relatively inefficient since approximately two-thirds of the light emitted may be absorbed by the color filters.

In another design, color-change materials convert light, for example blue light, of the common light-emitter into different colored light of the desired frequencies. The color-change materials absorb the high-frequency light and re-emit light at lower frequencies. For example, an OLED device may emit blue light suitable for a blue sub-pixel and employ a green color-change material to absorb blue light to emit green light and employ a red color change material to absorb blue light to emit red light. The color-change materials may be combined with color filters to further improve the color of the emitted light and to absorb ambient light and avoid exciting the color-change materials with ambient light, thereby improving device contrast. US20050116621 A1 entitled "Electroluminescent devices and methods of making electroluminescent devices including a color conversion element" describes the use of color-change materials or (color-conversion elements).

U.S. Patent Application 20040233139A1 discloses a color conversion member which is improved in the prevention of a deterioration in color conversion function, the prevention of reflection of external light, and color rendering properties. The color conversion member comprises a transparent substrate, two or more types of color conversion layers, and a color filter layer. The color conversion layers function to convert incident lights for respective sub-pixels to outgoing lights of colors different from the incident lights. The two or more types of color conversion layers are arranged on said transparent substrate. The color filter layer is provided on the transparent substrate side of any one of the color conversion layers or between the above any one of the color conversion layers and the color conversion layers adjacent to the above any one the color conversion layers. US 20050057177 also describes the use of color change materials in combination with color filters.

In general, color-change material systems suffer from efficiency problems. The production of relatively higher-frequency blue light can be difficult and the conversion of light from relatively higher frequencies to relatively lower frequencies may not be efficient or the conversion materials may fade over time, reducing the performance of the display. Moreover, much of the relatively higher-frequency light may not interact with the color-change materials and thus may not be converted to the desired, relatively lower frequency light. U.S. 2005/0140275A1 describes the use of red, green, and blue conversion layers for converting white light into three primary color of red, green, and blue light. However, the efficiency of emitted-light conversion remains a problem.

OLEDs rely upon thin-film layers of organic materials coated upon a substrate. OLED devices generally can have two formats known as small molecule devices such as disclosed in U.S. Pat. No. 4,476,292 and polymer OLED devices such as disclosed in U.S. Pat. No. 5,247,190. Either type of OLED device may include, in sequence, an anode, an organic EL element, and a cathode. The organic EL element disposed between the anode and the cathode commonly includes an organic hole-transporting layer (HTL), an emissive layer (EL) and an organic electron-transporting layer (ETL). Holes and electrons recombine and emit light in the EL layer. Tang et al. (Appl. Phys. Lett., 51, 913 (1987), Journal of Applied Physics, 65, 3610 (1989), and U.S. Pat. No. 4,769,292) demonstrated highly efficient OLEDs using such a layer structure. Since then, numerous OLEDs with alternative layer structures, including polymeric materials, have been disclosed and device performance has been improved.

Light is generated in an OLED device when electrons and holes that are injected from the cathode and anode, respectively, flow through the electron transport layer and the hole transport layer and recombine in the emissive layer. Many factors determine the efficiency of this light generating process. For example, the selection of anode and cathode materials can determine how efficiently the electrons and holes are injected into the device; the selection of ETL and HTL can determine how efficiently the electrons and holes are transported in the device, and the selection of EL can determine how efficiently the electrons and holes be recombined and result in the emission of light, etc.

It has also been found, that one of the key factors that limits the efficiency of OLED devices is the inefficiency in extracting the photons generated by the electron-hole recombination out of the OLED devices. Due to the high optical indices of the organic materials used, most of the photons generated by the recombination process are actually trapped in the devices due to total internal reflection. These trapped photons never leave the OLED devices and make no contribution to the light output from these devices. Because light is emitted in all directions from the internal layers of the OLED, some of the light is emitted directly from the device, and some is emitted into the device and is either reflected back out or is absorbed, and some of the light is emitted laterally and trapped and absorbed by the various layers comprising the device. In general, up to 80% of the light may be lost in this manner.

A typical OLED device uses a glass substrate, a transparent conducting anode such as indium-tin-oxide (ITO), a stack of organic layers, and a reflective cathode layer. Light generated from the device is emitted through the glass substrate. This is commonly referred to as a bottom-emitting device. Alternatively, a device can include a substrate, a reflective anode, a stack of organic layers, and a top transparent cathode layer. Light generated from the device is emitted through the top transparent electrode. This is commonly referred to as a top-emitting device. In these typical devices, the index of the ITO layer, the organic layers, and the glass is about 2.0, 1.7, and 1.5 respectively. It has been estimated that nearly 60% of the generated light is trapped by internal reflection in the ITO/ organic EL element, 20% is trapped in the glass substrate, and only about 20% of the generated light is actually emitted from the device and performs useful functions.

A variety of techniques have been proposed to improve the out-coupling of light from thin-film light emitting devices. Such techniques include the use of diffraction gratings, brightness enhancement films having diffractive properties, reflective structures, and surface and volume diffusers. The use of micro-cavity techniques is also known. However, none of these approaches cause all, or nearly all, of the light produced to be emitted from the device. Moreover, diffractive techniques cause a significant frequency dependence on the angle of emission so that the color of the light emitted from the device changes with the viewer's perspective. Scattering techniques are also known and described in, for example, co-pending, commonly assigned U.S. Ser. No. 11/065,082, filed Feb. 24, 2005 entitled "OLED device having improved light output" by Cok which is hereby incorporated in its entirety by reference.

It is also known to combine layers having color-conversion materials with scattering particles to enhance the performance of the color-conversion materials by increasing the likelihood that incident light will interact with the color-conversion materials, thereby reducing the concentration or thickness of the layer. Such combination may also prevent light emitted by the color-conversion material from being trapped in the color-conversion material layer. US20050275615 A1 entitled "Display device using vertical cavity laser arrays" describes such a layer as does US20040252933 entitled "Light Distribution Apparatus". US20050012076 entitled "Fluorescent member, and illumination device and display device including the same" teaches the use of color-conversion materials as scattering particles. US20040212296 teaches the use of scattering particles in a color-conversion material layer to avoid trapping the frequency-converted light. Co-pending, commonly assigned U.S. Ser. No. 11/361,094, filed Feb. 24, 2006 entitled "Light-Scattering Color-Conversion Material Layer" by Cok which is hereby incorporated in its entirety by reference describes integral light-scattering color-conversion material layers.

However, as described in U.S. Ser. No. 11/065,082, by Cok referenced above, the use of scattering layers without the use of low-index layers results in reduced sharpness in a pixilated device. Moreover, low-index layers, particularly in bottom-emitter devices, are difficult to build. Co-pending, commonly assigned U.S. Ser. No. 11/387,192, filed Mar. 23, 2006 entitled "OLED Device having Improved Light Output" by Cok which is hereby incorporated in its entirety by reference describes such a bottom-emitter OLED device, but the formation of the low-index elements described therein may be difficult. Hence, the use of scattering layers in concert with color-change materials is problematic, particularly for bottom-emitter OLED devices. In the absence of such scattering layers, prior-art solutions incorporating color-change materials for extracting trapped light may not be effective.

There is a need therefore for an improved color-change material layer that may be employed in organic or inorganic light-emitting diode device structures, that improves the efficiency and sharpness of the device.

SUMMARY OF THE INVENTION

In accordance with one embodiment, the invention is directed towards a color-change material layer comprising: a color-change material that converts light of a second frequency range higher than a first frequency range to light of the first frequency range; and a transparent material having a refractive index of at least 1.6 intermixed with the color-change material, wherein the layer is substantially non-scattering to light of the first frequency range. In particular embodiments, the color-change material layer may be employed in an organic or inorganic light-emitting diode device, and more particularly in a full-color display device.

ADVANTAGES

The present invention has the advantage that it improves the light output and sharpness of a light-emitting device.

It will be understood that the figures are not to scale since the individual layers are too thin and the thickness differences of various layers too great to permit depiction to scale.

DETAILED DESCRIPTION OF THE INVENTION

Figure 1:
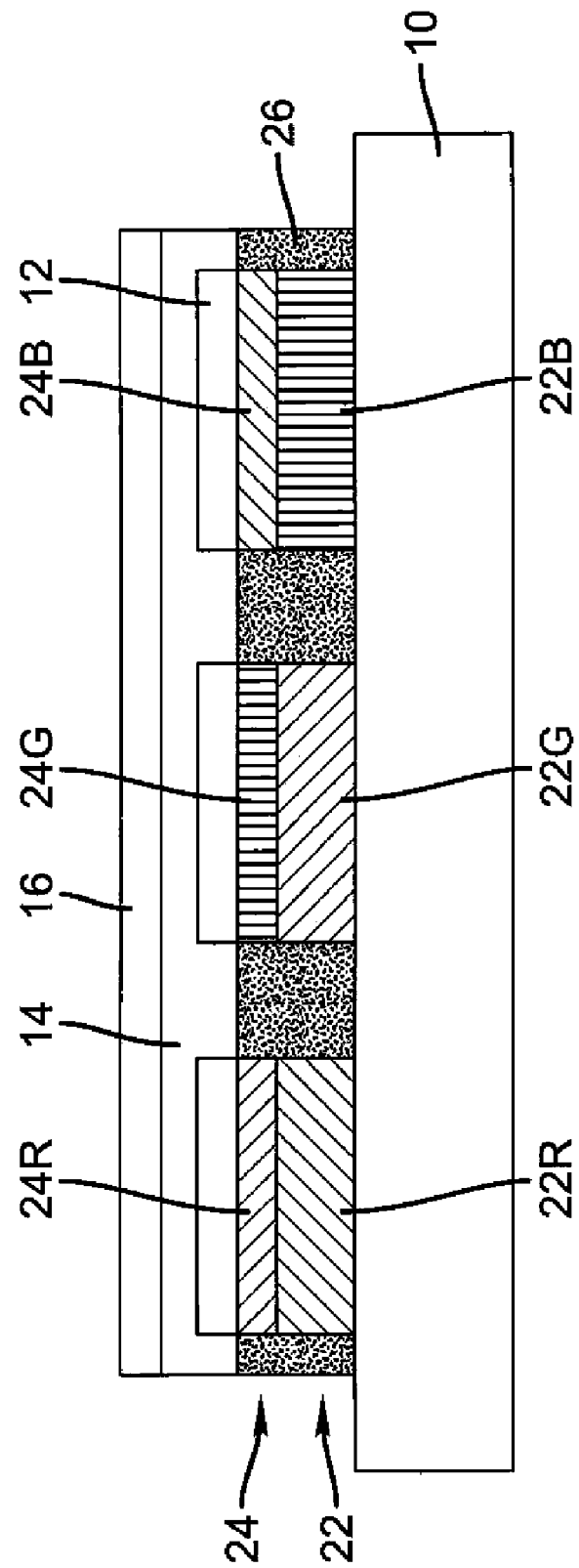
FIG. 1 is a cross section of a light-emitting device having color filters and color-change materials according to one embodiment of the present invention.

Referring to FIG. 1, one embodiment of an organic or inorganic LED device according to the present invention comprises a substrate 10, one or more color filters 22 formed above the substrate 10 and transmitting light having a first frequency range, a layer 24 of color-change material formed above the color filter 22 that converts light of a second frequency range higher than the first frequency range to light of the first frequency range, a first transparent electrode 12 formed adjacent to the color-change material layer 24; one or more layers 14 of organic material formed over the transparent electrode 12, at least one of which emits light in at least the second frequency range in response to a current passed therethrough; and a second electrode 16 formed over the one or more organic layers 14. The color-change material layer 24 is substantially non-scattering to light of the first frequency range, and additionally comprises a transparent material having a refractive index of at least 1.6 intermixed with the color-change material. Such relatively high refractive index intermixed transparent material may comprise material used to form the adjacent transparent electrode, such as ITO, or a distinct high index transparent material. In the first case, the color-change material layer 24 and the transparent electrode 12 may be essentially combined. In the second case, the color-change material layer 24 and the transparent electrode 12 may be distinct layers. By substantially non-scattering with respect to light of a designated frequency, it is meant that the color-change material layer of the invention redirects less than 25% of incident light of the designated frequency without converting the light to a lower frequency, preferably less than 10%, and more preferably less than 5%.

Figure 2:
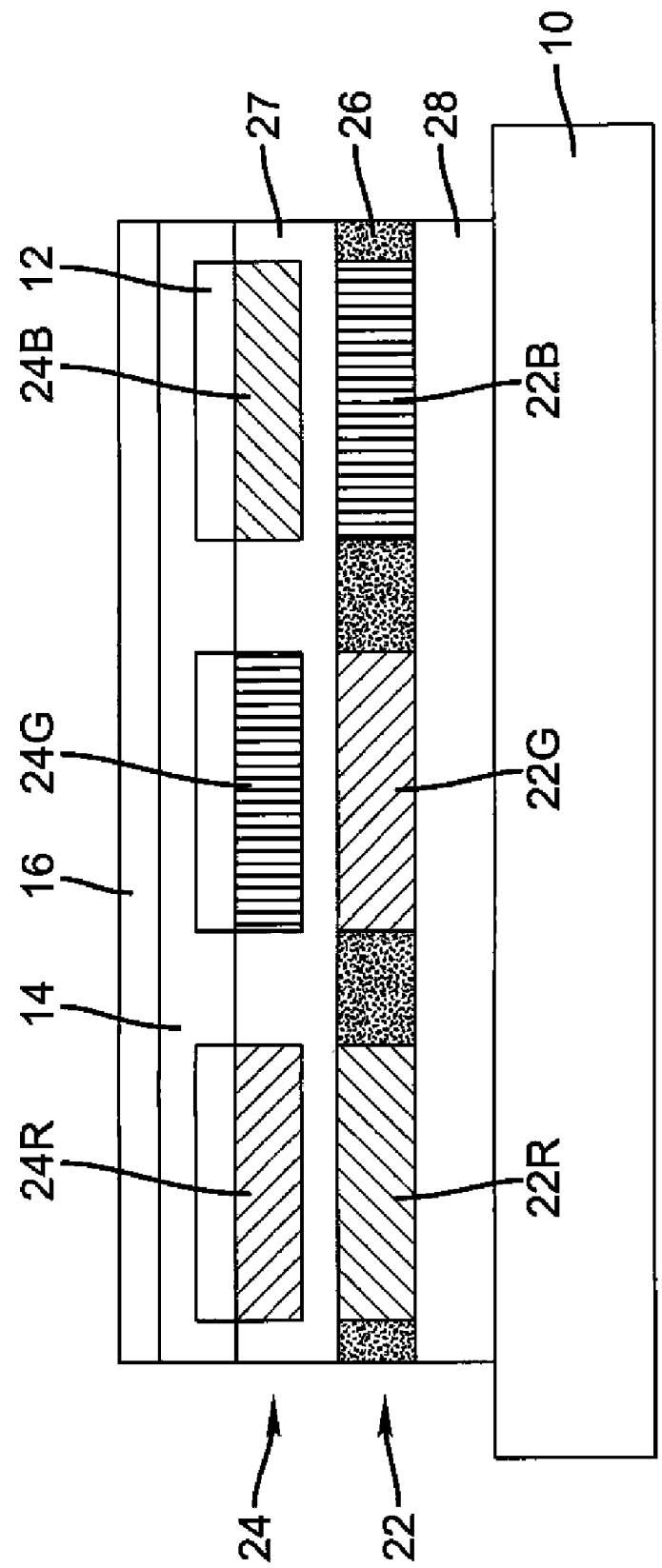
FIG. 2 is a cross section of a light-emitting device having color filters and color-change materials together with insulating and planarization layers according to another embodiment of the present invention.

The first transparent electrode 12, color filters 22, and color-change material 24 layers may be patterned to form individual light emitter elements controlled, for example by active- or passive-matrix control circuits (not shown). The color filters 22 may be patterned employing different colored filters, for example red 22R, green 22G, and blue 22B. The layer 24 of color-change materials may also be patterned employing different colored materials that convert relatively higher-frequency light to lower-frequency light, for example red 24R, green 24G, and blue 24B. The organic and second electrode layers 14 and 16 may be common to all of the light-emitting elements. Black matrix material 26 may be located between any of the patterned layers to absorb stray or ambient light. The second electrode 16 may be reflective. As shown in FIG. 2, additional planarization and insulating layers 27 and 28 may be formed between the substrate 10 and color filters 22. While the present invention is primarily described with respect toward organic light-emitting materials, in alternative embodiments, inorganic materials may be employed. While the figures depict a bottom-emitter configuration, in various embodiments the present invention may be employed in both a top-emitter and a bottom emitter configuration.

In further embodiments of the present invention, the color-change material layer is preferably also substantially non-scattering to light of the second frequency range and/or to white light. Moreover, the color-change material layer or any components comprising the layer may be substantially refractively or reflectively non-scattering to light of the first frequency range, second frequency range, and/or white light.

In one embodiment of the present invention, the transparent material having a refractive index of at least 1.6 may be the same material forming the transparent electrode 12, thereby forming the color-change material layer 24 and the transparent electrode 12 in a single layer.

Figure 3:
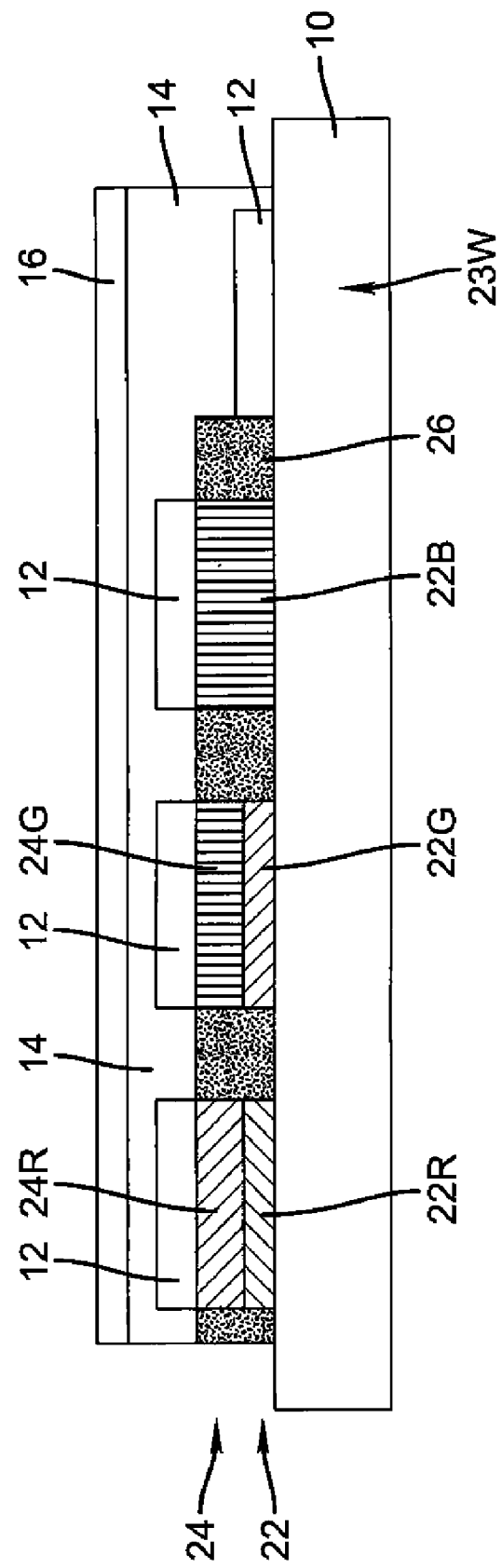
FIG. 3 is a cross section of a light-emitting device having color filters and color-change materials in an RGBW configuration according to an alternative embodiment of the present invention.

In one embodiment of the present invention, the organic light-emitting layer 14 may emit ultra-violet light. In another embodiment, the organic light-emitting layer 14 may emit blue light, in which case the blue color filter 22B and color-change material 24B may be omitted. In yet another embodiment, shown in FIG. 3, the organic light-emitting layer 14 may emit broadband or white light, in which case the blue color filter 22B may be included while the color-change material 24B may be omitted. Moreover, light-emitting elements 23W with neither a color filter 22 nor a color-change layer 24 may be provided, as shown. In this embodiment, the light-emitting elements may form a full-color display having pixels with red, green, blue, and white sub-pixels (RGBW).

Color-change material layers in accordance with the invention are preferably employed in light-emitting devices wherein the color-change material layer 24 is optically coupled with the transparent electrode 12. By optically coupled is meant that no layers having an optical index lower than the optical index of the transparent electrode 12 are present between the color-change material layer 24 and the transparent electrode 12. To enable this, according to one embodiment of the present invention, the color-change material layer 24 may be a common layer with the transparent electrode 12. Alternatively, in another embodiment of the present invention, the color-change material layer 24 may have an optical index equal to or greater than the optical index of the transparent electrode 12. Moreover, it is preferred that no layers having an optical index higher than the optical index of the substrate 10 or the color filters 22 be formed between the substrate 10 and the layer 24 of color-change material.

Figure 4:
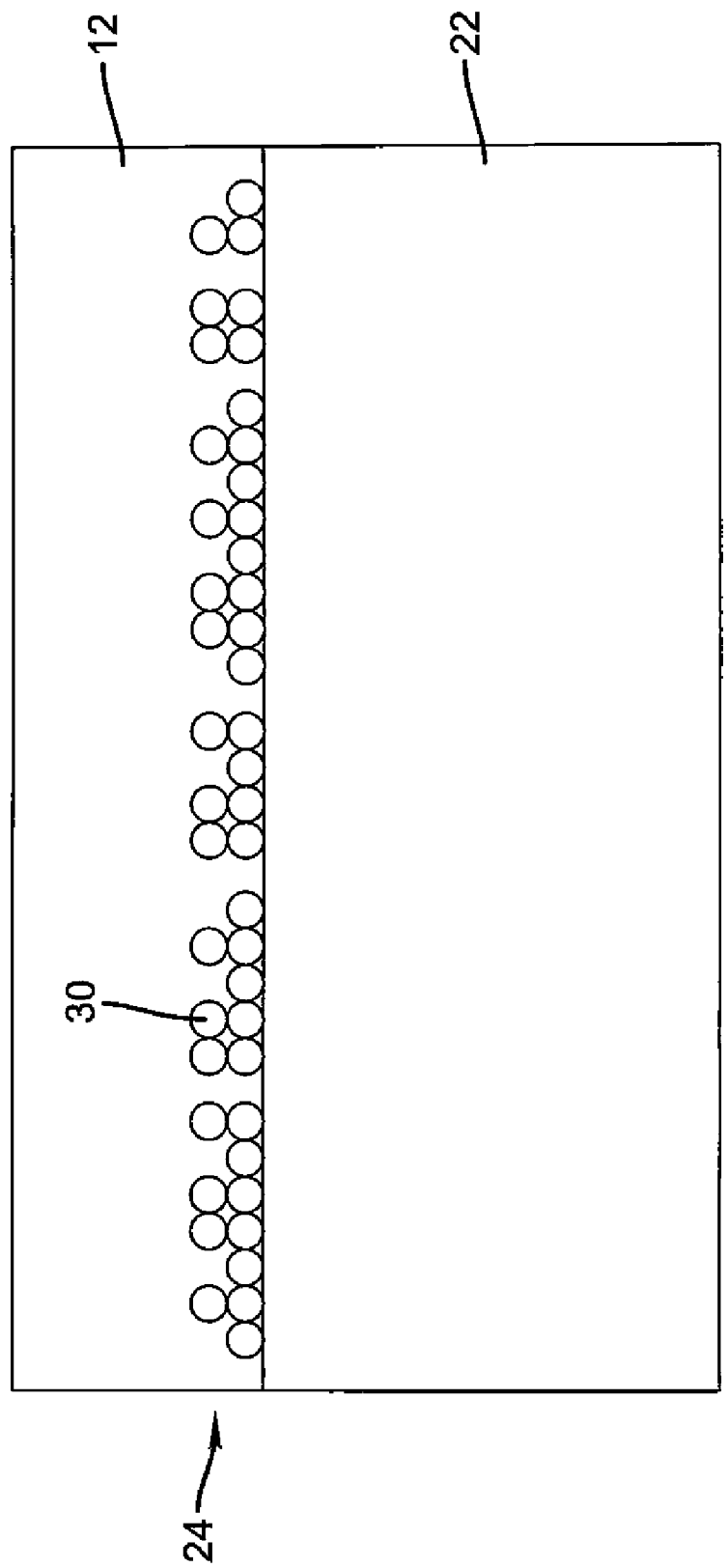
FIG. 4 is a cross section of a color-change material layer combined with a transparent electrode formed over a color filter according to an embodiment of the present invention.

However, layers of conventional resins and the like containing phosphorescent or fluorescent color change materials as taught in the prior art typically have optical indices approximately equivalent to that of a glass or plastic substrate, approximately 1.5, while transparent electrodes are typically formed from transparent conductive oxides such as indium tin oxide (ITO) having an optical index of 1.8 or higher. Hence, according to an embodiment of the present invention and as illustrated in FIG. 4, the color-change material layer may be formed as a non-planar layer of particles 30 with spaces between the particles 30. Subsequent deposition of a transparent electrode 12, for example by sputtering or vapor deposition, over the non-planar layer of color-change particles 30 will form transparent, conductive material between the particles. Such a layer 24 of color-change materials may be formed by providing a dispersion of color-change particles, for example quantum dots, in a solvent together with a small admixture (1% or 2% by weight) of a binder, for example urethane. The amount of binder may have an optical index of less than 1.6 but, because the quantity is so small it has no effect on the optical index of the non-planar layer of color-change materials. The dispersion is coated over the color filters 22 or a planarization layer 27, for example using spray or inkjet deposition, and dried. The dispersion may purposefully aggregate or flocculate the particles to form larger non-planar structures on the surface. The dried coating has spaces between the particles that may be filled with transparent conductive material to optically couple the transparent electrode 12 with the color-change material. Essentially, the color-change particles have become an intermixed part of the transparent electrode 12. Hence, a method of the present invention for forming a color-change material layer comprises the steps of: providing color-change material particles that converts light of a second frequency range higher than a first frequency range to light of the first frequency range in a binder to form a dispersion, and coating the dispersion on a substrate and drying the dispersion to form a non-planar surface of color-change material particles; and depositing a transparent material having an optical index of 1.6 on the dried dispersion, thereby intermixing the deposited transparent material with the color-change material and forming a color-change material layer having a refractive index of at least 1.6, wherein the layer is substantially non-scattering to light of the first frequency range.

Since the conductivity of the transparent electrode 12 is a critical factor in the electrical performance of the electrode, and because the color-change material may not be electrically conductive, in an alternative embodiment of the present invention, the color-change material is formed at a higher concentration on one side of the color-change material layer and at a lower concentration at the other side of the color-change material layer. In particular, the color-change material may be at a lower concentration one the side of the transparent electrode adjacent to the organic layers 14 and at a higher concentration on the side opposite the organic layers 14 to promote the conduction of current to the organic layers 14 (as illustrated in FIG. 4). The color change material layer 24 may be formed directly on the color filter 22.

It is an important feature of the present invention that the color-change material layer not scatter light substantially, nor that any other layers in the device substantially scatter light. By scattering light, it is meant that refractive or reflective elements or layers in the device substantially redirect light of a designated frequency passing through the layers. The absorption of light at one frequency and re-emission of light at a relatively lower frequency in a random direction as performed by color-change materials is not, as defined in this disclosure, light scattering. Hence, a homogenous layer of material having a single optical index will not scatter light, while a layer of high-index particles having a size on the order of the wavelength of visible light (from 400 nm to 700 nm) in a low-index binder will scatter light. Hence, according to the present invention, it is preferred that the color-change material comprise nano-particles or molecules having a size less than 400 nm, preferably less than 100 nm, and optionally less than 10 nm.

Figure 5:
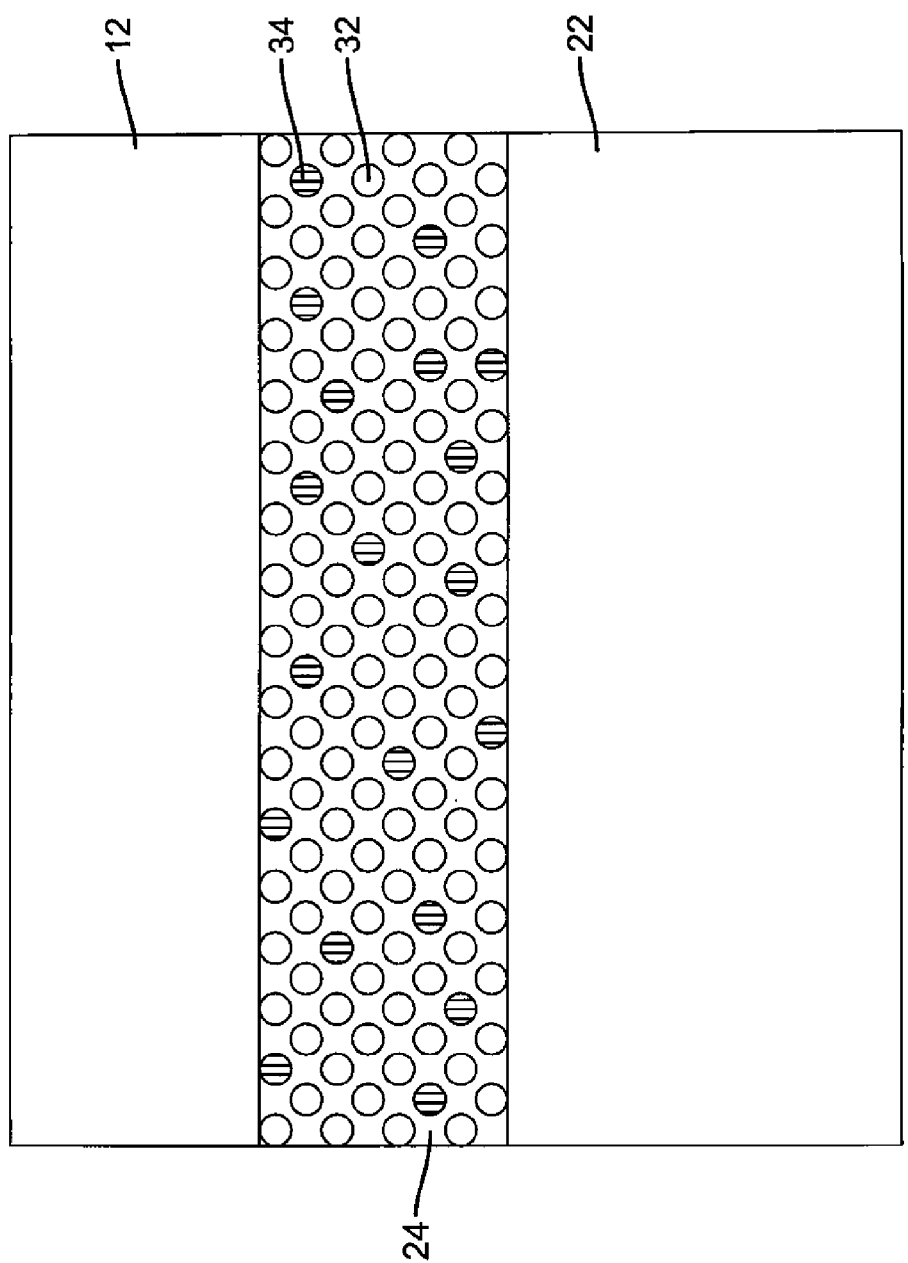
FIG. 5 is a cross section of a color-change material layer in direct optical contact with a transparent electrode formed over a color filter according to an alternative embodiment of the present invention.

Referring to FIG. 5, in an alternative method, a binder may be added to a dispersion having an admixture of high-index, nano-particles 32 and color-change materials 34 (either particles or molecules) to form a high-optical-index layer in direct optical contact with a subsequently deposited transparent electrode 12. In this case, the binder and nano-particles may form a smooth, planar surface coating on which the transparent electrode 12 is formed. Applicant has employed, e.g., high-index nano-particles of $TiO_2$ dispersed in a binder to form transparent, non-scattering high-index layers. As noted above, it is important that the high-index nano-particles not scatter light and hence may have a size less than 400 nm, less than 100 nm, or preferable less than 10 nm. Hence, a method of forming a color-change material layer according to an embodiment of the present invention comprises the steps of: providing a color-change material that converts light of a second frequency range higher than a first frequency range to light of the first frequency range; providing transparent particles having a refractive index of at least 1.6 and a diameter of less than 400 nm; and mixing the color-change material and transparent particles in a binder, and coating the mixture on a substrate to form a color-change material layer having a refractive index of at least 1.6, wherein the layer is substantially non-scattering to light of the first frequency range.

In operation, some of the light emitted by the light-emitting layer 14 may be emitted from the device. If the light has a frequency within the first frequency range it can pass through any associated filter 22. For example if red light is emitted it can pass through a red color filter. If the light has a second, higher frequency than the first frequency range, it may be absorbed by the color-change material layer 24 and be re-emitted as light having a frequency within the first frequency range, pass through any associated color filter 22, and be emitted from the device. For example, blue light may be absorbed by a red color-change material layer, re-emitted as red light, pass through the red color filter and be emitted from the device. Any relatively higher-frequency light that is not absorbed by an associated color-change material layer 24 may be absorbed by an associated color filter 22. If a blue emitting layer 14 is employed, no color filter 22 or color-change material layer 24 need be employed to form a blue light-emitting element. If a white-light emitting layer 14 emitting red, green, and blue light is employed, a blue color filter 22B may be employed for a blue light-emitting element but no color-change material layer 24B. In the case of an RGBW configuration, with a white-light emitting layer 14, no color filter 22 or color-change layer 24 may be employed to form a white light-emitting element.

As is known in the OLED art, for example as taught in commonly assigned U.S. Ser. No. 11/065,082 by Cok referenced above, the organic light-emitting layers may have an optical index lower than that of the transparent electrodes through which current is supplied to the light-emitting layers causing them to emit light. At the same time, the light-emitting layers have an optical index higher than that of the substrate or color filters on which they are formed. Hence, light emitted by the light-emitting layers at a relatively large angle to the substrate normal is trapped in the organic layers and the transparent electrode. In prior-art designs employing color change materials in relatively lower-index binders or with intervening planarization or insulating layers having a lower index, this trapped light may not interact with the color-change materials. However, according to preferred embodiments of the present invention, because the layer 24 of color-change materials is optically coupled with the transparent electrode 12, waveguided light that is otherwise trapped will be absorbed by the color-change materials and be re-emitted. Some of the re-emitted light will be emitted at a high angle and continue to be trapped. However, other of the light will be emitted at an angle that permits the light to be emitted from the device. Hence the present invention will convert some of the trapped, relatively high-frequency light into relatively lower-frequency emitted light, thereby improving the efficiency of the device.

The present invention has an additional advantage in improving the efficiency of the color-change material layer 24. Typically, not all light that passes through a color-change material layer will be absorbed, even when the light has an appropriate frequency. However, in the present invention, when the color-change material layer 24 is optically coupled with the transparent electrode 12, light will waveguide (or be trapped in) the combination of the light-emitting layer 14, the transparent electrode 12, and the color-change material layer 24. Hence, relatively higher frequency trapped light will repeatedly pass through the color-change material layer, thereby increasing the likelihood that the light will be absorbed and re-emitted at a relatively lower frequency as desired. This increases the efficiency of the color-change material layer 24.

As taught in commonly assigned U.S. Ser. No. 11/065,082 by Cok, referenced above, light that is scattered into a substrate or other thick layer may eventually be scattered out of the device far from the original point of emission, thereby reducing the sharpness of the device. However, preferred embodiments of the present invention have an advantage in that the color-change material layer 24 and the color filters 22 are so arranged as to prevent this from occurring. Light that is trapped in the substrate 10 may travel a long distance in the substrate 10. If this light is subsequently emitted, it may reduce the sharpness of the device. However, in the present invention, this may not occur because the color filters 22 absorb any light passing from the substrate 10 into a color-change material layer 24 that would otherwise excite the color-change material. For example, if a white-light emitter emits white light into the substrate, the white light may subsequently pass a red portion of the light into a red light-emitting element. However, this red component is not capable of exciting the red color-change materials. Moreover, the red color filter absorbs ambient light to prevent ambient excitation or trapped light excitation of the color-change materials. Hence, blue and green light are absorbed by the color filters and fail to excite the color-change materials. For example, if red, green, or blue light are emitted into the substrate, the green and blue light are absorbed by the red color filter 22R to prevent excitation of the red color-change materials. Likewise, the green color-change material layer 24G cannot be excited by light that passes into the substrate.

As used herein, a color filter is a layer of light-absorptive material that strongly absorbs light of one frequency range but largely transmits light of a different frequency range. For example, a red color filter will mostly absorb green- and blue-colored light while mostly transmitting red-colored light. Such color filter materials typically comprise pigments and dyes. As used herein, a color-change material (CCM), also known as a color-conversion layer, is a layer of material that absorbs light of one frequency range and re-emits light at a second, lower frequency range. Such materials are typically fluorescent or phosphorescent. Both materials are known in the prior art, however the color-change materials are occasionally referred to as color filters.

Color change materials that may be employed in the present invention are themselves also well-known. Such materials are typically fluorescent and/or phosphorescent materials that absorb light at higher frequencies (shorter wavelengths, e.g. blue) and emit light at different and lower frequencies (longer wavelengths, e.g. green or red). Such materials that may be employed for use in OLED devices in accordance with the present invention are disclosed, e.g., in U.S. Pat. Nos. 5,126,214, 5,294,870, and 6,137,459, US2005/0057176 and US2005/0057177, the disclosures of which are incorporated by reference herein. In particular, commercially available quantum dot particles such as core-shell quantum dots that absorb light at one frequency and re-emit light at a lower frequency are also known in the art (e.g., available from Evident Technologies, USA).

Light absorbing, black-matrix materials may also be employed between the color filters to further improve the absorption of ambient light. Such black-matrix materials may be formed from carbon black in a polymeric binder and located either on the cover, substrate, or formed on the OLED and employed to separate the patterned color filters or color-change materials. Black-matrix materials are well-known and may, for example, comprise a polymer or resin with carbon black.

In preferred embodiments, the cover and substrate may comprise glass or plastic with typical refractive indices of between 1.4 and 1.6. Transparent electrode 12 is preferably made of transparent conductive materials, for example indium tin oxide (ITO) or other metal oxides. The light-emitting material layer(s) 14 may comprise organic materials known in the art, for example, hole-injection, hole-transport, light-emitting, electron-injection, and/or electron-transport layers. Such organic material layers are well known in the OLED art. The light-emitting material layer(s) 14 typically have a refractive index of between 1.6 and 1.9, while indium tin oxide has a refractive index of approximately 1.8-2.1. Hence, the various organic and transparent electrode layers in the OLED have a refractive index range of 1.6 to 2.1. Of course, the refractive indices of various materials may be dependent on the wavelength of light passing through them, so the refractive index values cited here for these materials are only approximate. The present invention employs a color-change material layer 24 having at least an optical index of 1.6 so that the color-change material layer may be optically coupled with the light-emitting material layers 14. Preferably, the color-change material layer 24 has an optical index of at least 1.7, more preferably the color-change material layer 24 has an optical index of at least 1.8, and even more preferably the color-change material layer 24 has an optical index of at least 2.0. ITO and/or high index nanoparticles (e.g., $TiO_2$) may be employed to achieve such desired optical indices.

Most OLED devices are sensitive to moisture or oxygen, or both, so they are commonly sealed in an inert atmosphere such as nitrogen or argon, along with a desiccant such as alumina, bauxite, calcium sulfate, clays, silica gel, zeolites, alkaline metal oxides, alkaline earth metal oxides, sulfates, or metal halides and perchlorates. Methods for encapsulation and desiccation include, but are not limited to, those described in U.S. Pat. No. 6,226,890 issued May 8, 2001 to Boroson et al. In addition, barrier layers such as $SiO_x$ (x>1), Teflon, and alternating inorganic/polymeric layers are known in the art for encapsulation.

OLED devices of this invention can employ various well-known optical effects in order to enhance their properties if desired. This includes optimizing layer thicknesses to yield maximum light transmission, providing dielectric mirror structures, replacing reflective electrodes with light-absorbing electrodes, providing anti-glare or anti-reflection coatings over the display, providing a polarizing medium over the display, or providing neutral density filters over the display. Filters, polarizers, and anti-glare or anti-reflection coatings may be specifically provided.

The present invention may also be practiced with either active- or passive-matrix OLED devices. It may also be employed in display devices. In a preferred embodiment, the present invention is employed in a flat-panel OLED device composed of small molecule or polymeric OLEDs as disclosed in but not limited to U.S. Pat. No. 4,769,292, issued Sep. 6, 1988 to Tang et al., and U.S. Pat. No. 5,061,569, issued Oct. 29, 1991 to VanSlyke et al. Many combinations and variations of organic light-emitting displays can be used to fabricate such a device, including both active- and passive-matrix OLED displays having either a top- or bottom-emitter architecture. In further embodiments, the invention may be usefully employed with inorganic light-emitting diode units such as disclosed in U.S. Ser. No. 11/226,622, the disclosure of which is incorporated by reference herein.

The invention has been described in detail with particular reference to certain preferred embodiments thereof, but it will be understood that variations and modifications can be effected within the spirit and scope of the invention.

PARTS LIST

10 substrate
12 transparent electrode
14 light-emitting layer
16 electrode
22, 22R, 22G, 22B color filters
23W white-light emitting element
24, 24R, 24G, 24B color-change material layers
26 black matrix
27 planarization and/or insulating layer
28 planarization and/or insulating layer
30 color-change material particles
32 high-optical index particles
34 color-change material particles

The invention claimed is:
1. An OLED device including,
a substrate;
a first electrode;
a transparent second electrode;
an organic light emitting layer disposed between the first electrode and the transparent second electrode; and
wherein the transparent second electrode comprises:
color-change particles that convert light of a second frequency range higher than a first frequency range to light of the first frequency range;
a conductive transparent material having a refractive index of at least 1.6 intermixed with the color-change particles,
wherein the color-change particles are formed at a higher concentration on the side of the transparent second electrode away from the organic light emitting layer and at a lower concentration at the side of the transparent second electrode closest to the organic light emitting layer, and
wherein the transparent second electrode is substantially non-scattering to light of the first frequency range.

2. The OLED device of claim 1 wherein the transparent second electrode is substantially non-scattering to light of the second frequency range.

3. The OLED device of claim 1 wherein the transparent second electrode is substantially non-scattering to white light.

4. The OLED device of claim 1 wherein the color-change particles within the transparent second electrode are substantially non-scattering to light of the first frequency range, second frequency range, and/or white light.

5. A method of forming the transparent second electrode according to claim 1 comprising the steps of:
providing a color-change material that converts light of a second frequency range higher than a first frequency range to light of the first frequency range;
providing transparent particles having a refractive index of at least 1.6 and a diameter of less than 400 nm; and
mixing the color-change material and transparent particles in a binder, and coating the mixture on a substrate to form the transparent second electrode having a refractive index of at least 1.6, wherein the layer is substantially non-scattering to light of the first frequency range.

6. A method of forming the transparent second electrode according to claim 1 comprising the steps of:
providing color-change material particles that converts light of a second frequency range higher than a first frequency range to light of the first frequency range in a binder to form a dispersion; and
coating the dispersion on a substrate and drying the dispersion to form a non-planar surface of color-change material particles;
depositing a transparent material having an optical index of 1.6 on the dried dispersion, thereby intermixing the deposited transparent material with the color-change material and forming the transparent second electrode having a refractive index of at least 1.6, wherein the layer is substantially non-scattering to light of the first frequency range.

7. The OLED device of claim 1 wherein the conductive transparent material having a refractive index of at least 1.6 is ITO.

8. An OLED device comprising:
a substrate;
one or more color filters formed above the substrate and transmitting light having a first frequency range;
a first transparent electrode formed over the color filters comprising color-change particles that convert light of a second frequency range higher than the first frequency range to light of the first frequency range, and a conductive transparent material having a refractive index of at least 1.6 intermixed with the color-change particles, wherein the first transparent electrode is substantially non-scattering to light of the first frequency range and the color-change particles are formed at a higher concentration on one side of the first transparent electrode and at a lower concentration at the other side of the first transparent electrode;
one or more layers of organic light-emitting materials which emits light in at least the second frequency range in response to a current passed there-through formed over the first transparent electrode; and
a second electrode formed over the one or more layers of light-emitting materials; and
wherein the OLED device comprises a plurality of differently colored light-emitting elements formed over different locations on the substrate, each differently colored light-emitting element comprises a differently colored color filter and corresponding color-change particles and wherein the different colors include at least two of red, green or blue.

9. The OLED device of claim 8 wherein the one or more layers of light emitting materials emit broadband or white light.

10. The OLED device of claim 8 further comprising light-emitting elements formed in different locations that do not include color-change particles.

11. The OLED device of claim 8 wherein the OLED device forms a full-color display having red, green, blue, and white light-emitting elements.

12. The OLED device of claim 8 wherein the first transparent electrode is formed directly on the one or more color filters.

13. The OLED device of claim 8 wherein the conductive transparent material having a refractive index of at least 1.6 is ITO.

* * * * *